United States Patent [19]
Gfeller et al.

[11] Patent Number: 6,077,022
[45] Date of Patent: Jun. 20, 2000

[54] PLACEMENT MACHINE AND A METHOD TO CONTROL A PLACEMENT MACHINE

[75] Inventors: Martin Gfeller, Schalunen; Otto Christen, Oensingen; Emil Grunder, Hägendorf, all of Switzerland

[73] Assignee: Zevatech Trading AG, Sezach, Switzerland

[21] Appl. No.: 09/021,723

[22] Filed: Feb. 10, 1998

[30] Foreign Application Priority Data

Feb. 18, 1997 [CH] Switzerland ................. 360/97

[51] Int. Cl.⁷ .................. H05K 13/02; B65H 20/22; B65G 47/06
[52] U.S. Cl. .............. 414/416; 414/811; 221/25; 221/71; 221/211; 226/120
[58] Field of Search ............. 414/416; 29/740, 29/741, 743, 759, 832, 833, 834; 156/344, 577, 584; 226/120; 221/25, 31, 211

[56] References Cited

U.S. PATENT DOCUMENTS

| | | | |
|---|---|---|---|
| Re. 34,615 | 5/1994 | Freeman | 348/95 |
| 3,337,941 | 8/1967 | Drop et al. | 29/203 |
| 4,144,449 | 3/1979 | Funk et al. | 250/221 |
| 4,151,945 | 5/1979 | Ragard et al. | 228/6 A |
| 4,346,293 | 8/1982 | Fetzer | 250/222 R |
| 4,351,264 | 9/1982 | Flaum et al. | 118/203 |
| 4,378,134 | 3/1983 | Eddy | 308/3.5 |
| 4,383,359 | 5/1983 | Suzuki et al. | 29/712 |
| 4,584,047 | 4/1986 | Vanderpool et al. | 156/361 |
| 4,610,083 | 9/1986 | Campisi et al. | 29/832 |
| 4,615,093 | 10/1986 | Tews et al. | 29/407 |
| 4,653,664 | 3/1987 | Hineno et al. | 221/3 |
| 4,819,326 | 4/1989 | Stannek | 29/837 |
| 4,819,699 | 4/1989 | Brown et al. | 140/103 |
| 4,820,369 | 4/1989 | Kubo | 156/344 |
| 4,853,072 | 8/1989 | Thompson | 156/470 |
| 4,863,149 | 9/1989 | Luther et al. | 269/8 |
| 4,915,770 | 4/1990 | Haeda et al. | 156/344 |
| 4,923,089 | 5/1990 | Hineno et al. | 221/1 |
| 4,934,891 | 6/1990 | Hawkswell | 414/223 |
| 4,937,511 | 6/1990 | Herndon et al. | 318/568.21 |
| 4,943,342 | 7/1990 | Golemon | 156/584 |
| 4,986,462 | 1/1991 | Hethcoat | 228/180.1 |
| 5,023,544 | 6/1991 | Vallone et al. | 324/158 F |
| 5,024,720 | 6/1991 | Boss et al. | 156/584 |
| 5,025,973 | 6/1991 | Newton et al. | 228/55 |
| 5,046,851 | 9/1991 | Morgan | 356/375 |
| 5,060,063 | 10/1991 | Freeman | 358/101 |
| 5,075,965 | 12/1991 | Carey et al. | 29/840 |
| 5,084,959 | 2/1992 | Ando et al. | 29/740 |
| 5,086,559 | 2/1992 | Akatsuchi | 29/834 |
| 5,150,423 | 9/1992 | Hoki | 382/8 |
| 5,157,617 | 10/1992 | Ramsey | 364/478 |
| 5,157,734 | 10/1992 | Chen et al. | 382/8 |
| 5,191,693 | 3/1993 | Umetsu | 29/429 |
| 5,195,234 | 3/1993 | Pine et al. | 29/720 |

(List continued on next page.)

FOREIGN PATENT DOCUMENTS

| | | | |
|---|---|---|---|
| 0 236 225 | 2/1987 | European Pat. Off. | H05K 13/02 |
| 0 236 225 | 9/1987 | European Pat. Off. | H05K 13/02 |
| 0 340 100 | 11/1989 | European Pat. Off. | G06K 19/06 |
| 0 476 577 | 9/1991 | European Pat. Off. | H05K 13/00 |

(List continued on next page.)

*Primary Examiner*—Dean J. Kramer
*Assistant Examiner*—Gerald J. O'Connor
*Attorney, Agent, or Firm*—D'Alessandro & Ritchie

[57] ABSTRACT

The present invention provides for safe and simple replacement or removal of individual feeders from a placement machine without any loss in performance by using a signal means to emit a signal to the CPU of the placement machine when a feeder is removed. Upon receipt of this signal, the CPU controls the pick-up head in such a way so that it does not collide with the feeder being removed. If the pick-up head is located directly above the pick-up position of the feeder to be removed, it can be moved momentarily upwards or sideways thanks to its fast drive before a collision occurs. If the pick-up head is located just on the way to the pick-up position of the feeder, the procedure is momentarily aborted so that a collision can be avoided.

17 Claims, 2 Drawing Sheets

U.S. PATENT DOCUMENTS

| | | | |
|---|---|---|---|
| 5,213,653 | 5/1993 | Akahori et al. | 156/584 |
| 5,248,362 | 9/1993 | Sissons | 156/205 |
| 5,249,239 | 9/1993 | Kida | 382/8 |
| 5,275,657 | 1/1994 | Duffy et al. | 118/224 |
| 5,278,634 | 1/1994 | Skunes et al. | 356/400 |
| 5,289,625 | 3/1994 | Umetsu et al. | 29/426.3 |
| 5,309,223 | 5/1994 | Konicek et al. | 356/375 |
| 5,311,304 | 5/1994 | Monno | 348/87 |
| 5,342,460 | 8/1994 | Hidese | 156/64 |
| 5,380,099 | 1/1995 | Teramachi | 384/45 |
| 5,400,497 | 3/1995 | Watanabe et al. | 29/705 |
| 5,415,693 | 5/1995 | Yoneda et al. | 118/664 |
| 5,455,409 | 10/1995 | Smith et al. | 235/385 |
| 5,459,794 | 10/1995 | Ninomiya et al. | 382/145 |
| 5,475,919 | 12/1995 | Wu et al. | 29/841 |
| 5,488,771 | 2/1996 | Devitt et al. | 29/898.02 |
| 5,499,756 | 3/1996 | Banerji et al. | 228/214 |
| 5,515,600 | 5/1996 | Iwasaki et al. | 29/740 |
| 5,547,537 | 8/1996 | Reynolds et al. | 156/351 |
| 5,553,376 | 9/1996 | Solanki et al. | 29/833 |
| 5,559,727 | 9/1996 | Deley et al. | 364/559 |
| 5,562,384 | 10/1996 | Alvite et al. | 414/222 |
| 5,564,188 | 10/1996 | Akasako et al. | 29/898.03 |
| 5,592,562 | 1/1997 | Rooks | 382/150 |
| 5,650,081 | 7/1997 | Hudson | 219/229 |
| 5,669,970 | 9/1997 | Balog et al. | 118/213 |
| 5,694,443 | 12/1997 | Stone et al. | 377/6 |
| 5,708,419 | 1/1998 | Isaacson et al. | 340/572 |
| 5,713,125 | 2/1998 | Watanabe et al. | 29/833 |
| 5,715,594 | 2/1998 | Patterson et al. | 29/842 |
| 5,735,040 | 4/1998 | Ochi et al. | 29/841 |
| 5,788,379 | 8/1998 | Reeve | 384/41 |
| 5,838,754 | 11/1998 | Olson et al. | 364/478.07 |
| 5,885,052 | 3/1999 | Tsuji et al. | 414/744.6 |
| 5,941,674 | 8/1999 | Briehl | 414/417 |

FOREIGN PATENT DOCUMENTS

| | | | |
|---|---|---|---|
| 0 462 596 A1 | 12/1991 | European Pat. Off. | H01L 21/00 |
| 0 476 577 A2 | 3/1992 | European Pat. Off. | H05K 13/00 |
| 0 647 943 A1 | 4/1995 | European Pat. Off. | G11C 5/00 |
| 0 649 719 A1 | 4/1995 | European Pat. Off. | B29C 45/14 |
| 0 682 321 A2 | 11/1995 | European Pat. Off. | G06K 19/077 |
| 2 548 857 | 7/1983 | France | H05K 3/00 |
| 28 34 836 | 8/1978 | Germany | H05K 13/00 |
| 29 39 102 | 9/1979 | Germany | B05C 1/08 |
| 34 24 323 A1 | 7/1984 | Germany | H05K 13/02 |
| 35 44 221 | 12/1985 | Germany | H05K 13/04 |
| 35 44 221 A1 | 12/1985 | Germany | H05K 13/04 |
| 37 36 563 | 10/1987 | Germany | H05K 13/02 |
| 37 36 563 A1 | 10/1987 | Germany | H05K 13/02 |
| 41 27 696 | 8/1991 | Germany | H05K 13/02 |
| 41 27 696 A1 | 8/1991 | Germany | H05K 13/02 |
| 62-083964 | 4/1987 | Japan | B65H 19/10 |
| 63-097564 | 4/1988 | Japan | B65H 20/20 |
| 2-135800 | 5/1990 | Japan | H05K 13/08 |
| 2-303751 | 12/1990 | Japan | B23Q 15/22 |
| 3-008655 | 1/1991 | Japan | B65H 26/00 |
| 3-133763 | 6/1991 | Japan | B65D 73/02 |
| 5-145283 | 6/1993 | Japan | H05K 13/02 |
| 6-089910 | 3/1994 | Japan | H01L 21/52 |
| 8-340175 | 12/1996 | Japan | H05K 3/34 |
| 9-046088 | 2/1997 | Japan | H05K 13/02 |
| 9-064094 | 3/1997 | Japan | H01L 21/60 |
| 2 111 863 | 12/1981 | United Kingdom | B05B 13/00 |
| 2 183 820 | 6/1987 | United Kingdom | G05D 3/10 |

PLACEMENT MACHINE AND A METHOD TO CONTROL A PLACEMENT MACHINE

PRIORITY CLAIM

This application claims the priority of earlier filed Swiss application number 360/97, filed on Feb. 18, 1997.

BACKGROUND OF THE INVENTION

1. Field of the Invention

The present invention relates to the field of placement technology. More specifically, the present invention relates a placement machine and a method to control a placement machine.

2. The Prior Art

The automatic placement of electronic circuits (PCBs or similar) by means of placement machines has been known for some time and is used, in particular, whenever complex and extensive circuits are required to have a fairly laroe number of components placed on them quickly, efficiently, and without a large number of errors. The components in this process are sorted by type on individual tapes which are rolled on reels fed in steps, by means of a corresponding feeder, past a pickup position where they are picked up by a handling machine and placed in their allocated position in the circuit. In this process, the components are stored individually on the tape in pockets positioned periodically one after the other and are normally protected against falling or damage by an overlying cover tape. Such automatic placement devices are known, for example, from U.S. Pat. Nos. 4,610,083, 4,653,664, 5,191,693, 5,289,625 and 5,515,600.

Because the electronic circuits for component placement normally contain a variety of different components, and because a separate feeder is usually required on the placement machine for each component, the feeder means are designed in a space-saving manner so that the largest possible number of them can be fit next to each other on the placement machine and still be reached by the pickup head of the placement machine in a short time (see here, for example, the figures from U.S. Pat. No. 5,515,600 or FIG. 13 of European Patent Document No. A2-0 476 577). The minimum width of the feeder is determined by the width of the tape used for the components.

During the operation of such a placement machine, it frequently occurs that the stored components runout in individual feeders, or that a feeder with one component type has to be replaced with another feeder with a different component type. In order to insert new tape reels or to replace the feeder, the affected feeder must be removed by the operator. If this is done during an on-going placement process, the situation may arise where the pick-up head is just performing a pick-up process at the affected feeder or is just traveling to the feeder for the pick-up of a component while the affected feeder is being removed. In this case, a collision may occur between the pick-up head and the feeder which may damage the relatively sensitive pick-up head, as well as the feeder. Even if the motion of the pick-up head is correctly followed by the operator—which is difficult in view of the high speed of the pick-up head—incorrect placements may occur after the removal of the feeder if the pick-up head actually travels to the empty position of the removed feeder. While it is, in principle, feasible to interrupt the placement process and to stop the placement machine for each removal of a feeder in order to avoid these problems, such a procedure will lead to substantial delays in the placement procedure, which can generally not be tolerated.

It is therefore the object of the present invention to provide a placement machine and a feeder and a method for its control in which a replacement or removal of an individual feeder can be made at any time safely, in a simple way, and without any loss in performance.

It is a further object of the present invention to provide a feeder which can be taken out of the placement machine without risk and in a controlled manner during the placement procedure.

It is a further object of the present invention to provide for a pick-up process which can be aborted in a controlled manner.

It is a further object of the present invention to provide for a feeder which can be logged off at the central processing unit of the placement machine (machine computer) in a controlled manner.

It is a further object of the present invention to provide for an apparatus and process where no placement errors occur during the feeder removal from the placement machine during the placement process.

It is a further object of the present invention to provide for no loss in performance, because the placement machine can continue as a defined process in the placement program and a subsequent placement can be performed as soon as the missing feeder is replaced.

It is a further object of the present invention to provide for no occurrence of collision with the placement tool (pick-up head) when the pick process is aborted in a controlled manner.

BRIEF DESCRIPTION OF THE INVENTION

The present invention provides for safe and simple replacement or removal of individual feeders from a placement machine without any loss in performance by using a signal means to emit a signal to the CPU of the placement machine when a feeder is removed. Upon receipt of this signal, the CPU controls the pick-up head in such a way so that it does not collide with the feeder being removed. If the pick-up head is located directly above the pick-up position of the feeder to be removed, it can be moved momentarily upwards or sideways thanks to its fast drive before a collision occurs. If the pick-up head is moving toward the way to the pick-up position of the feeder, the procedure is momentarily aborted so that a collision can be avoided.

A first preferred embodiment of the placement machine in accordance with the invention is characterized by a connection between the inserted feeder and the placement machine for the exchange of control signals, and a signal means located in the feeder said signal means providing a feeder-removal signal to the CPU of the placement machine by the connection, said signal means comprising a switch device which is automatically actuated upon removal of the feeder, the feeder being locked in its inserted state on the placement machine and the signal means being automatically actuated when the feeder is unlocked. It is thus ensured that the pick-up head has sufficient time to react to the removal of the feeder.

The feeders in accordance with the presently preferred embodiment of the invention are characterized by, a snap-in latch provided on the side of each feeder facing the placement machine used to lock the feeder; with (2) an actuating element used to actuate the snap-in latch, located on the outside of the feeder; (3) a connecting element, leading through the feeder used to link the snap-in latch and the actuating element; and (4) the signal means or the switch device actively connected with the snap-in latch, the actuating element or the connecting element. In this way, the desired signal emission can be realized in a simple manner in the feeder.

The method in accordance with the presently preferred embodiment of the invention is characterized by a signal being generated when the feeder means is taken out during an on-going placement procedure and being forwarded to the CPU of the placement machine, with the CPU aborting any placement procedure relating to the feeder means on the basis of the take-out signal.

In accordance with the embodiment of the method of the invention, on the basis of the feeder removal signal, the removed feeder is is logged off at the CPU of the placement machine and the pick-up head no longer accesses components from the removed feeder after the log-off. The placement machine continues placement using feeders remaining in the placement machine after the log-off of the feeder taken out. A signal is emitted to the CPU of the placement machine once the feeder taken out is replaced, which signal logs the feeder back on and, if necessary, a subsequent placement is performed with components from the newly-loaded feeder means. In this way, delays due to the replacement or temporary taking out of a feeder can be fully avoided or reduced to a minimum.

DETAILED DESCRIPTION OF THE INVENTION

Figure 1:
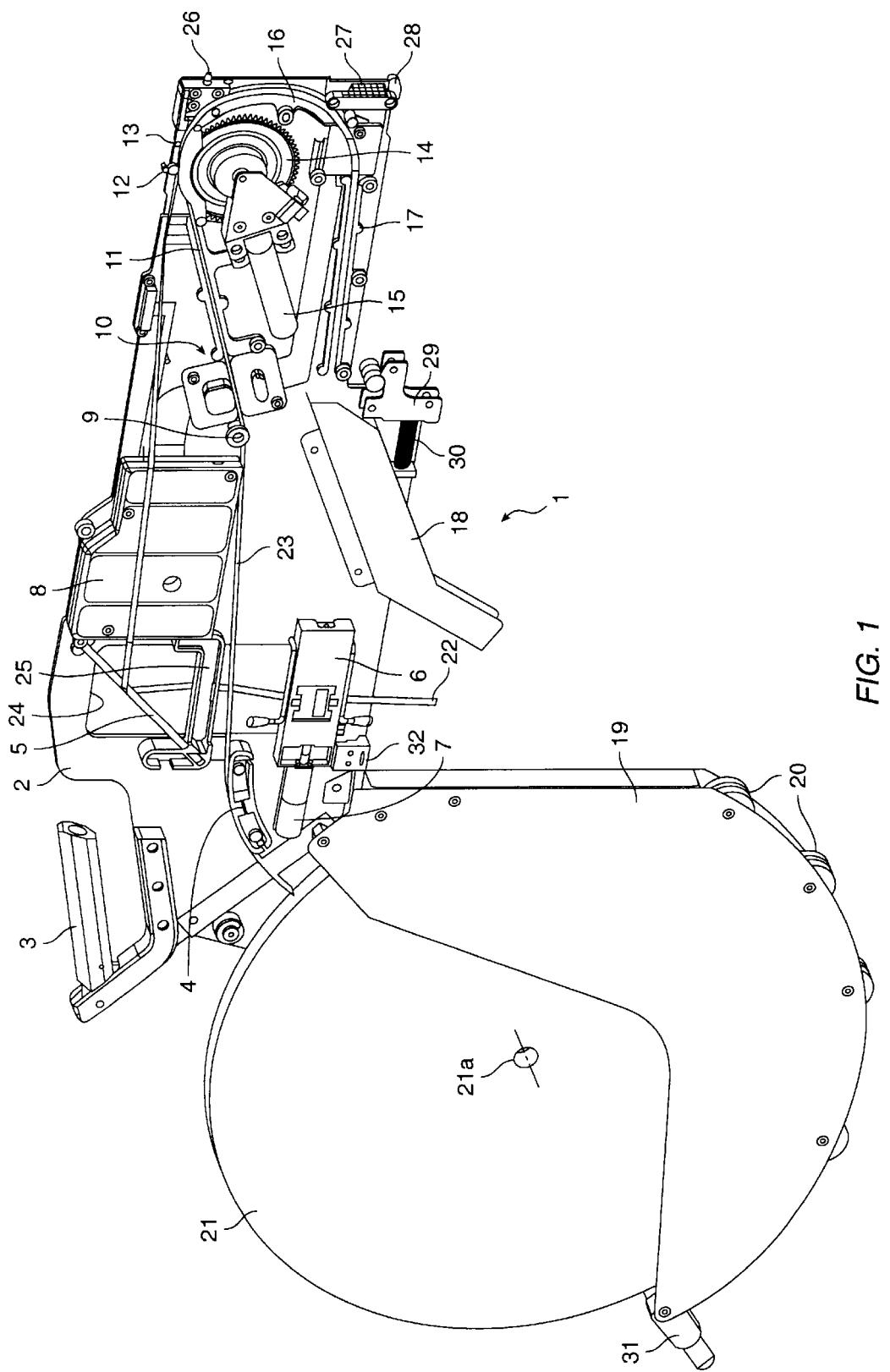
FIG. 1 shows a perspective view of a preferred embodiment of a feeder in accordance with the present invention.

Referring to FIG. 1, a preferred embodiment of a feeder in accordance with the invention is shown in a perspective side view. The feeder 1 is mounted on a base plate 2 made from metal, on which a reel cassette 19 has been screwed. The reel cassette 19 is open towards the top. A reel 21 with the tape wound on it containing the components can be inserted in it and turned freely on a plurality of rollers 20 positioned on the lower edge of the reel cassette 19. The axle 21a of the reel 21 has no function here. The tape 23 is guided to the front and out of the reel 21 through the central part of feeder 1, where at a pickup position 13 a pickup head (not shown in FIG. 1, 34 in FIG. 2) of a placement machine (not shown in FIG. 1, 35 in FIG. 2) picks up the components.

Below the pickup position 13, a transport gear 14 driven by a drive motor 15 is positioned. The transport gear 14 is designed as a cog and engages with its teeth corresponding perforations in the tape 23. The transport of the tape 23 by the transport gear 14 is performed in steps and is controlled by an electronic control unit 8 which is fitted in the feeder means 1. The guidance of the tape 23 from out of the reel 21 to the transport gear 14 is effected via a first, slightly bent guide element 4, a corner pulley 9 and a first guidance channel 11. Between the corner pulley 9 and the entrance to the first guidance channel an (optical) tape sensor 10 is provided which is used to detect the tape end or the end of a tape section.

The tape 23 comprises a supply tape provided with pockets for the components which is closed by a glued cover tape. Prior to the pickup position 13, the cover tape 22 is pulled off to the back counter to the transport direction of the tape 23 by means of a pull-off device 12 such as is described U.S. Pat. No. 5,213,653. The supply tape is led around the transport gear 14 behind the pickup position 13 by a second, curved guidance channel 16 and to the back by a third, straight guidance channel 17 and directed downwards and out of the feeder means 1 by a further guidance element 18.

The cover tape 22 pulled off runs without any further guidance past the control unit 8 to a deflector shaft 5 and is there deflected downwards and simultaneously turned through 90 degrees in the tape axis so that the surface of the cover tape 22 behind the deflector shaft 5 is orientated roughly parallel to the base plate 2. The combined deflection and turning of the cover tape is achieved by the deflector shaft 5 lying in the plane of the tape 23 or the cover tape 22 and by the deflector shaft 5 enclosing an angle of around 45 degrees with the direction of travel of the cover tape 22 removed.

The deflector shaft 5 is positioned somewhat above the base plate 2. So that the deflected cover tape 22 can be placed easily around the deflector shaft 5 and guided below the deflector shaft 5 safely past the tape 23 running past there, a recess 24 is provided in the base plate 2 below the deflector shaft 5 and in the area between the deflector shaft 5 and the drive unit 6. The cover tape 22 is led past the tape 23 in its orientation turned through 90 degrees in the recess 24. To guide the cover tape 22 in the recess 24, a guide element is provided which has, in particular, the shape of a stationary stirrup 25 positioned laterally to the direction of the cover tape 22.

The cover tape 22 pulled off is transported (pulled) by means of a drive unit 6 driven by a separate drive motor 7, which drive unit 6 is positioned below the stirrup 25 at the lower edge of the recess 24. The drive unit 6 for the cover tape 22 lies in the tape plane, i.e. the drive axle is parallel to the tape plane or to the base plate 2. To insert the cover tape 22 a flipup top part can be opened and then closed again in a known manner on the drive unit 6.

The feeder 1 is inserted with its front section, in which the transport gear is positioned, into a corresponding mount in the placement machine. A guide pin 26 at the top and a guide nose 28 located on the bottom side serve to guide and center. A connection to the placement machine for the exchange of electrical signals is created by a multiple plug contact 27 placed between the guide pin 26 and the guide nose 28. This configuration is essentially already known from the applicant's U.S. Pat. No. 5,024,720.

The lower edge of the base plate 2 has, in the front section of the feeder 1, a shoulder on which a swivelling snap-in latch 29 is located, which engages a hook-shaped continuation behind a retaining element on the placement machine and locks the feeder 1 in the fitted position on the placement machine. The snap-in latch 29 is actuated or swivelled by means of a mechanical connecting element 30 in the form of a Bowden cable or similar, which connecting element is led outside along the reel cassette 19 to a revolving lever-like actuating element 31 The actuating element 31 sits on the outer tip of the reel cassette 19. When it is actuated, the snap-in latch 29 swivels into its unlocked position and the feeder 1 can be taken out of the placement machine by means of the handle 3.

Figure 2:
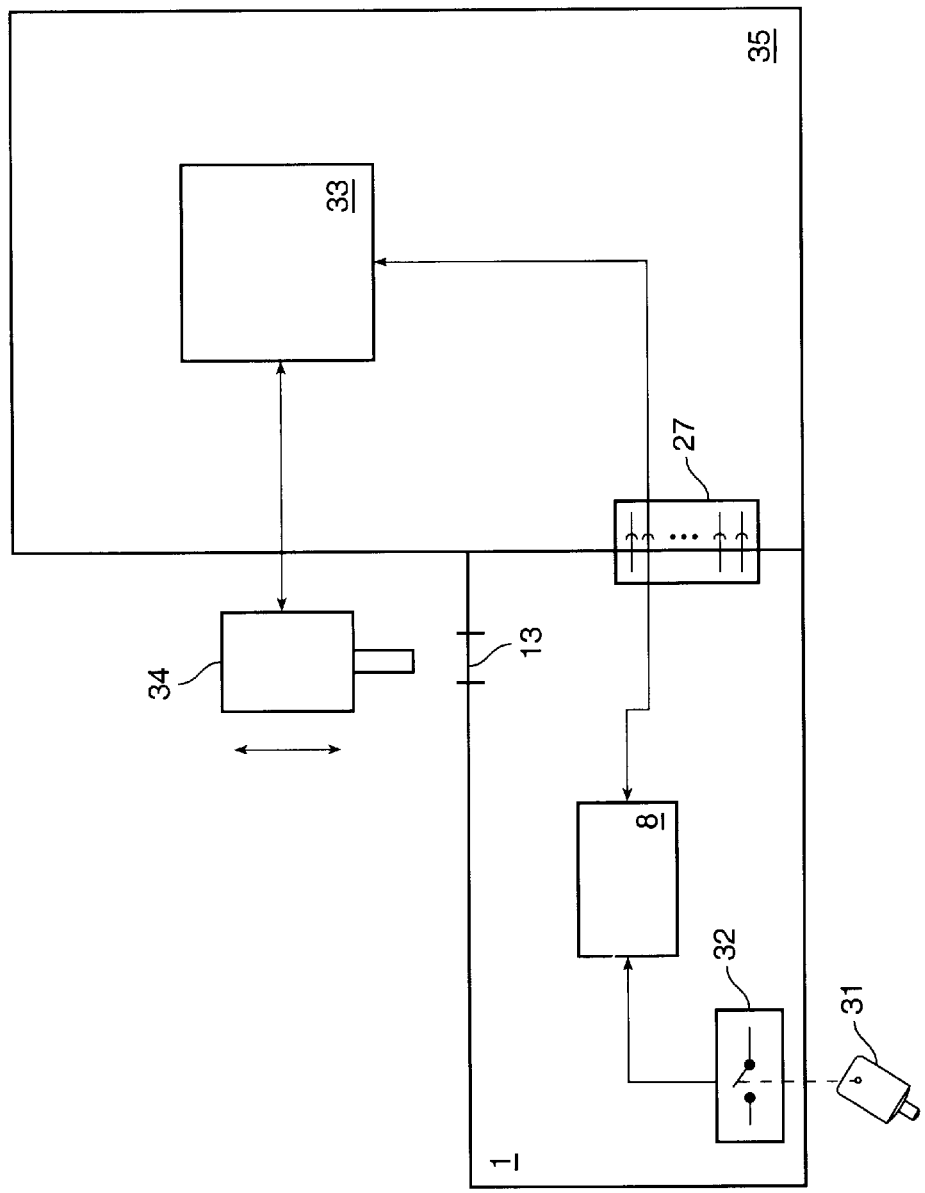
FIG. 2 shows a block diagram of the control of the placement machine with the feeder in accordance with the present invention.

By the actuation of the actuating element 31—as is shown schematically in FIG. 2 simultaneously with the unlocking of the feeder 1, a switch device 32 is actuated in the feeder 1 which emits a signal to the control unit 8 in the feeder 1. This signal is forwarded by the control unit 8 via the plug contact 27 to a central processing unit (CPU) 33 in the automatic placement machine 35. The CPU 33 then momentarily steers the pick-up head 34 of the placement machine 35 out the collision zone with the feeder 1 (if a pick-up from the feeder 1 is just being performed) or ensures that the pick-up head 34 does not enter the collision zone (if a pick-up from the feeder 1 was just planned). The collision zone here is in the direct proximity of the pick-up position 13.

At the same time, the feeder 1 taken out is logged off at the CPU 33 of the placement machine 35 on the basis of the take-out signal. After being logged-off, feeder 1 is no longer accessed by the pick-up head 34, so that incorrect placements due to the non-inserted feeder 1 are safely avoided. After logging off of the feeder 1 taken out, the placement machine 35 continues placement by means of other feeders remaining in the placement machine 35. The components of the missing feeder (1) are here deliberately omitted or skipped. Once the feeder 1 taken out is put back in, a signal is then emitted to the CPU 33 of the placement machine 35, which logs the feeder 1 back on again. If necessary a subsequent placement with components of the replaced feeder 1 is performed so that the circuit to be mounted is completely finished without any time loss.

We claim:

1. A placement machine including:
   one or more feeders, removably connected to the placement machine;
   each of said one or more feeders containing a tape containing components for placement;
   a pick-up position for each of said one or more feeders;
   a pick-up head for picking up said components;
   a CPU coupled to said pick-up head; and
   a signal means located in each of said one or more feeders which emits a signal to said CPU when a specific feeder corresponding to said signal means is removed from the placement machine.

2. The placement machine of claim 1, further including a connection between each of said one or more feeders and the placement machine for the exchange of control signals.

3. The placement machine of claim 2, wherein each of said one or more feeders is locked in an inserted state on the placement machine and said signal means is automatically actuated when said specific feeder is removed.

4. The placement machine of claim 3, wherein each of said one or more feeders includes:
   a snap-in latch for locking and unlocking said specific feeder in the placement machine;
   an actuating element to actuate said snap-in latch;
   a connecting element connecting said snap-in latch and said actuating element;
   said signal means being actively connected to said snap-in latch, said actuating element or said connecting element.

5. The placement machine of claim 1, wherein said signal means comprises a switch device which is automatically actuated when said specific feeder is removed.

6. The placement machine of claim 5, wherein each of said one or more feeders is locked in an inserted state on the placement machine and said signal means is automatically actuated when said specific feeder is removed.

7. The placement machine of claim 6, wherein each of said one or more feeders includes:
   a snap-in latch for locking and unlocking said specific feeder in the placement machine;
   an actuating element to actuate said snap-in latch;
   a connecting element connecting said snap-in latch and said actuating element;
   said signal means being actively connected to said snap-in latch, said actuating element or said connecting element.

8. The placement machine of claim 1, wherein each of said one or more feeders is locked in an inserted state on the placement machine and said signal means is automatically actuated when said specific feeder is removed.

9. The placement machine of claim 8, wherein each of said one or more feeders includes:
   a snap-in latch for locking and unlocking said specific feeder in the placement machine;
   an actuating element to actuate said snap-in latch;
   a connecting element connecting said snap-in latch and said actuating element;
   said signal means being actively connected to said snap-in latch, said actuating element or said connecting element.

10. A method to control a placement machine equipped with one or more feeders removably connected to the placement machine, each of said one or more feeders comprising a tape containing components for placement, including the steps of:
    automatically generating a control signal when a feeder from said one or more feeders is removed from the placement machine; and
    controlling a pick-up head with a CPU which responds to said control signal to prevent collisions between said feeder and said pick-up head.

11. The method of claim 10, further including the step of:
    steering said pick-up head to a position where said feeder can be removed from the placement machine without endangering said pick-up head.

12. The method of claim 11 further including the steps of:
    logging off said feeder when said CPU detects said control signal; and
    stopping said pick-up head from travelling to said feeder after said logging off.

13. The method of claim 12 further including the steps of:
    continuing said pick-up and placement process using any remaining feeder in the placement machine which is not logged off;
    signaling said CPU to log a new feeder back on when said new feeder is inserted in the placement machine; and
    continuing said pick-up and placement process using said new feeder after said new feeder is logged back on.

14. The method of claim 13, wherein said new feeder is selected from the group consisting of said feeder and a different feeder.

15. The method of claim 10 further including the steps of:
    logging off said feeder when said CPU detects said control signal; and
    stopping said pick-up head from travelling to said feeder after said logging off.

16. The method of claim 15 further including the steps of:
    continuing said pick-up and placement process using any remaining feeder in the placement machine which is not logged off;
    signaling said CPU to log a new feeder back on when said new feeder is inserted in the placement machine; and
    continuing said pick-up and placement process using said new feeder after said new feeder is logged back on.

17. The method of claim 16, wherein said new feeder is selected from the group consisting of said feeder and a different feeder.

* * * * *

UNITED STATES PATENT AND TRADEMARK OFFICE
CERTIFICATE OF CORRECTION

PATENT NO: 6,077,022
DATED: June 20, 2000
INVENTOR(S): Martin Gfeller, Otto Christen and Emil Grunder It is certified that error appears in the above-identified patent and that said Letter Patent are hereby corrected as shown below:

In column 1 line 16 delete "laroe" and insert - - large- - .

In column 2 lines 41-42 delete "moving toward the way to the pick-up position" and insert - -moving toward the pick-up position--.

In column 2 line 58 delete "by, a snap-in" and insert - -by: (1) a snap-in - - .

In column 2 line 60 delete "feeder; with (2) an actuating" and insert - - feeder; (2) an actuating- -.

Signed and Sealed this

First Day of May, 2001

Attest:

NICHOLAS P. GODICI

Attesting Officer

Acting Director of the United States Patent and Trademark Office